United States Patent
Baiocco et al.

(10) Patent No.: US 7,081,397 B2
(45) Date of Patent: Jul. 25, 2006

(54) TRENCH SIDEWALL PASSIVATION FOR LATERAL RIE IN A SELECTIVE SILICON-ON-INSULATOR PROCESS FLOW

(75) Inventors: Christopher V. Baiocco, Highland, NY (US); An L. Steegen, Stamford, CT (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 10/929,990

(22) Filed: Aug. 30, 2004

(65) Prior Publication Data

US 2006/0046428 A1    Mar. 2, 2006

(51) Int. Cl.
*H01L 21/76* (2006.01)
(52) U.S. Cl. .............. 438/426; 438/222; 438/413; 438/447; 257/501; 257/513; 216/39
(58) Field of Classification Search ........ 438/444–447, 438/703, 735, 911, 243, 426, 423; 216/39; 257/501, 513
See application file for complete search history.

(56) References Cited

U.S. PATENT DOCUMENTS

| | | | | |
|---|---|---|---|---|
| 4,507,158 A | | 3/1985 | Kamins ................... 148/175 |
| 4,888,300 A | * | 12/1989 | Burton .................... 438/404 |
| 5,153,813 A | * | 10/1992 | Oehrlein et al. ........... 361/313 |
| 5,427,975 A | * | 6/1995 | Sparks et al. ............... 438/52 |
| 6,020,250 A | * | 2/2000 | Kenney ................... 438/422 |
| 6,245,636 B1 | * | 6/2001 | Maszara ................... 438/411 |
| 6,420,771 B1 | | 7/2002 | Gregory ................... 257/517 |
| 6,461,529 B1 | | 10/2002 | Boyd ....................... 216/67 |
| 6,723,617 B1 | * | 4/2004 | Choi ...................... 438/424 |
| 6,936,522 B1 | * | 8/2005 | Steegen et al. ............ 438/426 |
| 2002/0197782 A1 | | 12/2002 | Kitamura ................. 438/200 |
| 2003/0104675 A1 | * | 6/2003 | Lim et al. ................ 438/424 |
| 2005/0164468 A1 | * | 7/2005 | Steegen et al. ............ 438/424 |
| 2005/0215007 A1 | * | 9/2005 | Cheng et al. ............. 438/244 |

OTHER PUBLICATIONS

Ho, C.P., Plummer, J.D "Si/SiO2 Interface Oxidation Kinetics: A Physical Model for the Influence of High Substrate Doping Levels: I. Theory," Journal of the Electro-chemical Society: Solid-State ☐Science and Technology, p. 1516 (Sep. 1979).

Ho, C.P., Plummer, J.D. "Si/SiO2 Interface Oxidation Kinetics: A Physical Model for the Influence of ☐High Substrate Doping Levels: II. Comparison with Experiment and Discussion," Journal of the ☐Electrochemical Society: Solid-State Science and Technology, p. 1523 (Sep. 1979).

Wolf, S., Tauber, R.N. "Silicon Processing for the VLSI Era: Volume 1—Process Technology," ☐Lattice Press, California, 2nd Edition (2000) ISBN 0-9616721-6-1.

* cited by examiner

*Primary Examiner*—Matthew Smith
*Assistant Examiner*—John M. Parker
(74) *Attorney, Agent, or Firm*—Graham S. Jones; H. Daniel Schnurmann

(57) ABSTRACT

A lateral trench in a semiconductor substrate is formed by the following steps. Form a lateral implant mask (LIM) over a top surface of the semiconductor substrate. Implant a heavy dopant concentration into the substrate through the LIM to form a lateral implant region (LIR) in the substrate. Strip the LIM exposing the top surface of the substrate. Form an epitaxial silicon layer over the top surface of the substrate burying the LIR. Form a trench mask over the epitaxial layer. Etch a trench reaching through the epitaxial layer and the LIR. Form oxidized trench sidewalls, an oxidized trench bottom and oxidized sidewalls of the LIR. Etch the oxidized sidewalls of the LIR until the LIR is exposed. Form laterally extending trenches by etching away the LIR.

20 Claims, 17 Drawing Sheets

TRENCH SIDEWALL PASSIVATION FOR LATERAL RIE IN A SELECTIVE SILICON-ON-INSULATOR PROCESS FLOW

BACKGROUND OF THE INVENTION

This invention relates to formation of lateral isolation trenches in semiconductor substrates and more particularly to enhanced methods of control of etching of the lateral trenches into which isolation dielectric is to be deposited.

Copending, commonly assigned U.S. Pat. No. 6,936,522 of An L. Steegan, Maheswaran Surendra, Hsing-Jen Wann. Ying Zhang, Franz Zach, and Robert Wong filed on 26 June 2003 entitled "Selective Silicon-on-Insulator Isolation Structure and Method" describes a method of forming Lateral isolation Regions. That method is susceptible to several non-idealities that may be encountered, when adapting it to sub-90 nm technology nodes. A potential problem with the approach described therein stems from the fact that the lateral RIE selectivity is finite. Hence, undoped silicon which is exposed on the sidewalls of a vertical trench is unintentionally removed from the vertical trench sidewalls. Additionally, the trench depth control, which is a critical parameter since conventional devices not utilizing SSOI rely heavily on the vertical trench for electrical isolation is achieved through the crude method of physical sputtering. This leads to a dangerous co-dependence between the lateral and vertical etch components.

The effect upon etching of doped silicon oxide is described in the three references 1–3 including two articles and portions of the text of a book cited below.
1. Ho, C. P., Plummer, J. D "Si/SiO$_2$ Interface Oxidation Kinetics: A Physical Model for the Influence of High Substrate Doping Levels: I. Theory," Journal of the Electro-chemical Society: Solid-State Science and Technology, p. 1516 (September 1979).
2. Ho, C. P., Plummer, J. D. "Si/SiO$_2$ Interface Oxidation Kinetics: A Physical Model for the Influence of High Substrate Doping Levels: II. Comparison with Experiment and Discussion," Journal of the Electrochemical Society: Solid-State Science and Technology, p. 1523 (September 1979).
3. Wolf, S., Tauber, R. N. "Silicon Processing for the VLSI Era: Volume 1—Process Technology," Lattice Press, California, $2^{nd}$ Edition (2000) ISBN 0-9616721-6-1.

Selective Silicon-On-Insulator (SSOI) methods include diverse methods of preferentially isolating device regions in addition to the device-to-device isolation utilized by the respective technology (i.e. Shallow-Trench Isolation (STI), LOCal-area Oxidation of Silicon (LOCOS), etc.). In the current state of the art, there are 3-Dimensional (3D) control issues that could prevent SSOI methods from being implemented in sub-90 nm technology nodes, unless some inherent problems are overcome, as will be manifest from the following discussion.

FIGS. 1A–1H illustrate some of the processing steps of a prior art method leading to the formation of an SSOI device 8 with a vertical trench 18T formed in a lightly doped silicon, semiconductor substrate with lateral trenches 18LT extending the sides of the vertical trench as shown in FIG. 1H.

Referring to FIG. 1A, the first step in forming a device 8 is to start with a bulk monocrystalline silicon substrate 9 which has been lightly doped with a dopant, preferably a P-type dopant, although it could be N-type dopant. Then the top surface of the substrate 9 is blanketed with a pad layer 10 that is preferably composed of silicon oxide (SiO$_2$). Then a pad nitride layer 13 (where nitride refers to silicon nitride (Si$_3$N$_4$)) was deposited as a blanket onto the pad oxide film 10. Next a photoresist (PR1) mask 51 was formed on the surface of the pad nitride layer 13. The PR1 mask 51 has been patterned photolithographically with a window(s) 51W therethrough exposing a portion(s) of the top surface of the blanket pad nitride layer 13. The window 51W exposes a portion of the top surface of the pad nitride layer 13.

FIG. 1B shows the device 8 of FIG. 1A after the window 51W has been extended down to the top surface of the substrate 9 by etching an opening(s) through the pad nitride 13 layer, thereby forming a patterned implant mask 13M, followed by etching an opening(s) through the pad oxide film 10 to create a patterned pad oxide structure 10' with the window 51W extending therethrough down to expose the top surface of the substrate 9. Opening of the window 51W through the pad oxide layer 10 at this point is an option which may be deferred until after implantation of ions 14N as illustrated in FIG. 1C.

FIG. 1C shows the device 8 of FIG. 1B after stripping photoresist mask 51. More particularly, FIG. 1C shows substrate 9 after formation of a lateral heavily doped or preferably counterdoped heavily doped lateral region(s) 14 (doped with N-type dopant) therein extending to a shallow depth in the surface of the substrate 9. The lateral, heavily N− counterdoped (P− doped), region 14 shown in FIG. 1C is formed where a lateral trench(es) is to be formed in preparation for creation of a lateral isolation region(s) of the kind shown in FIG. 1G. The term Lateral Isolation Region refers to a nonconducting volume within a semiconductor substrate to be filled with an isolating dielectric material that defines the bottom border of device source/drain (S/D) regions. In FIG. 1C a heavy dose of N type dopant ions 14N are shown being implanted into the top surface of the substrate 9 to a shallow depth, as described in U.S. patent application Ser. No. 10/604,102 of Steegan et al., the teachings thereof are incorporated herein by reference. Next, FIG. 1D shows the device 8 of FIG. 1C after the shallow implant of ions 14N has been completed followed by a subsequent anneal. Then the implant mask 13M (pad nitride) and remaining pad oxide 10' have been stripped exposing the top surface of the substrate 9 including the top surface of the lateral, heavily doped region 14.

Next, FIG. 1E shows the device 8 of FIG. 1D after a blanket silicon layer 11 was grown epitaxially (hereinafter referred to as epitaxial silicon layer 11) with uniform thickness over the top surface of device 8 thereby burying both the lightly-doped substrate 9 and lateral, N− heavily doped region(s) 14, with equal thicknesses of epitaxial silicon.

FIG. 1F shows the device 8 of FIG. 1E after preparation steps have begun preparing for formation of features comprising a vertical isolation trench 18T shown in FIG. 1G that will extend down into the bulk silicon substrate 9. First, a blanket pad oxide film 12 is grown over the epitaxial layer 11. Then a blanket CMP (Chemical Mechanical Planarization) stop layer 15 and a blanket silicon oxide hard mask layer 16 are formed over the pad layer 10. The next step is to form a second, (PR2) mask 57 (e.g. patterned photoresist) over the hard mask layer 16. The second, PR2 mask 57 has a window 57W therethrough which has been used to etch through the hard mask layer 16 and the stop layer 15. As a result, the window 17 reaches down to expose the top surface of the pad layer 10. Some processes may extend the window 57W through pad oxide film 12 providing breakthrough of the pad oxide film 12.

FIG. 1G shows the device 8 of FIG. 1F after the second, PR2 mask 57 has been stripped followed by etching through the window 57W to extend window 57W through the pad layer 10 down to the bulk silicon substrate 9. Then etching continues down into the bulk silicon substrate 9 to form a vertical isolation trench 18T aligned to intersect with the buried, lateral (i.e. laterally extending), heavily doped/counterdoped region(s) 14. The anisotropic, vertical etching stops after it has extended through the doped region(s) 14 bisecting them thereby and forming lateral heavily doped regions 14L extending laterally from the trench(es) 18T. Preferably the vertical isolation trench(es) 18T is (are) formed in the bulk silicon substrate 9 by Reactive Ion Etching (RIE). The result is that the vertical isolation trenches 18T (which are aligned with the heavily doped lateral region(s) 14 in the substrate 9 to intersect therewith) provide access to the heavily doped lateral region(s) 14 in preparation for removal of the remainder of the heavily doped silicon thereby hollowing out the remainder of the lateral regions 14L to form lateral trenches 18LT, (laterally extending trenches) buried in the substrate 9, as seen in FIG. 1H.

FIG. 1H shows the device 8 of FIG. 1G after bombardment with ions 20 combined with lateral isotropic RIE etching to achieve the final depth of the vertical trench 18 with vertical extension 22 while etching laterally to empty out the lateral heavily doped or counterdoped lateral regions 14L to form the lateral trenches 18LT extending transversely from the trench 18T. Also illustrated is the resolution loss of horizontal critical dimensions.

FIG. 2A shows a photo-micrograph of a semiconductor device after formation of a vertical trench the prior art anisotropic etching process as indicated in FIG. 1C.

FIG. 2B shows a photo-micrograph of a semiconductor device after formation of a vertical trench with a lateral trench on the right side thereof by the prior art isotropic etching process and ion bombardment as indicated in FIG. 1D. It can be seen that the pattern produced deviates significantly from the idealized pattern shown in FIG. 1D.

SUMMARY OF THE INVENTION

This invention improves 3D control by decoupling the processing needed to etch under device regions (lateral isolation) from the processing needed to segregate the devices (vertical/conventional isolation).

An object to this invention is to provide a solution to the problem of unwanted collateral etching of the substrate during the formation of the lateral trench.

The present invention employs passivation of exposed, undoped surface areas bounding silicon volume that is intended to be retained.

Another object of this invention is to decouple the lateral and vertical RIE processes.

An object of this invention is to employ the low $SiO_2$ etch rate of a lateral RIE process combined with dissimilar doped/undoped oxide etch rates.

In accordance with an aspect of this invention, a method of forming a lateral trench in a semiconductor substrate includes the following steps. Form a lateral implant mask on top of the semiconductor substrate. Implant a heavy concentration of dopant into the substrate through the lateral implant mask forming a lateral implant region in the substrate. Strip the lateral implant mask exposing the top of the substrate. Form an epitaxial silicon layer over the top of the substrate burying the lateral implant region. Form a trench mask over the epitaxial layer. Etch a trench reaching through the epitaxial layer and the lateral implant region. Form oxidized trench sidewalls, an oxidized trench bottom and oxidized sidewalls of the lateral implant region. Etch the oxidized sidewalls of the lateral implant region until the lateral implant region is exposed. Form a laterally extending trench in the substrate by etching the lateral implant region.

Preferably, prior to forming the implant mask, blanket the substrate with a thin dielectric pad layer and an implant mask layer in that order. Then form a first a patterned photoresist mask over the implant mask layer. Then etch the pattern in the first photoresist mask into the implant mask layer and strip the first photoresist mask.

Preferably, implant a heavy concentration of dopant into the substrate through the lateral implant mask forming a lateral implant region in the substrate after forming the implant mask.

Preferably, perform an activation anneal immediately after implanting the heavy concentration of dopant into the substrate through the lateral implant mask.

Preferably, strip the implant mask subsequent to the activation anneal and prior to forming the epitaxial silicon layer.

Preferably, prior to formation of the trench mask, form a pad oxide film, a planarization stop layer, a hard mask layer and a second photoresist mask with a trench patterned window therethrough over the epitaxial layer.

Preferably, complete formation of the trench mask by etching a trench window through the hard mask layer, the planarization stop layer and the pad oxide film, through the trench patterned window.

Preferably, etch a trench window through the hard mask layer, the planarization stop layer and the pad oxide film, through the trench patterned window to form the trench mask. Then strip the second photoresist mask. Then etch the trench reaching through the epitaxial layer and the lateral implant region.

Preferably, etch the oxidized trench sidewalls, the oxidized trench bottom and the oxidized sidewalls of the lateral implant region with a wet etch.

Preferably, form the lateral trenches by dry etching away the lateral implant region.

In accordance with another aspect of this invention, a method of forming a lateral trench in a semiconductor substrate comprises the following steps. Form a lateral implant mask on top of the semiconductor substrate. Implant a heavy concentration of dopant into the substrate through the lateral implant mask forming a lateral implant region in the substrate. Strip the lateral implant mask exposing the top of the substrate. Form an epitaxial silicon layer on top of the substrate burying the lateral implant region. Form a trench mask on the epitaxial layer. Etch a trench reaching through the epitaxial layer and bisecting the lateral implant region. Form oxidized trench sidewalls, an oxidized trench bottom and oxidized sidewalls of the lateral implant region. Wet etch the oxidized sidewalls of the lateral implant region exposing the lateral implant region. Then form a laterally extending trench in the substrate by dry etching away the lateral implant region.

Preferably, prior to forming the implant mask, form a blanket thin dielectric pad layer and a blanket implant mask layer over the epitaxial silicon layer in that order; form a first patterned photoresist mask over the blanket implant mask layer; etch the pattern in that mask into the blanket implant mask layer; and strip that mask.

Preferably, implant a heavy concentration of dopant into the substrate through the lateral implant mask forming a lateral implant region in the substrate following the formation of the implant mask.

Preferably, perform an activation anneal immediately after implanting the heavy concentration of dopant into the substrate through the lateral implant mask.

Preferably, strip the implant mask subsequent to the activation anneal and prior to forming the epitaxial silicon layer.

Preferably, form a pad oxide film, a planarization stop layer, a hard mask layer and a second photoresist mask with a trench patterned window therethrough over the epitaxial layer prior to formation of a trench mask.

Preferably, etch a trench window through the hard mask layer, the planarization stop layer and the pad oxide film, through the trench patterned window to form the trench mask.

Preferably, etch a trench window through the hard mask layer, the planarization stop layer and the pad oxide film, through the trench patterned window to form the trench mask. Then strip the second photoresist mask. Next etch the trench reaching through the epitaxial layer and the lateral implant region.

Preferably, the planarization stop layer is composed of silicon nitride.

Preferably, the hard mask layer formed over the planarization stop layer is composed of silicon oxide.

The invention and objects and features thereof will be more readily apparent from the following detailed description and appended claims when taken with the drawings.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

An enhanced method for building the type of SSOI device 8 shown in FIGS. 1A–1H in accordance with this invention is described below with reference to FIGS. 3A–3K which illustrate some of the processing steps for preparation thereof in accordance with the method of this invention. The method of this invention includes the preliminary fabrication steps leading to the formation of an SSOI device 38 shown in FIG. 3K with a vertical trench 19B/19D lined with silicon oxide 20L formed in a silicon semiconductor substrate 9 with the lateral trenches 19LT extending from the sides of the vertical trench 19B/19D.

Figure 1A:
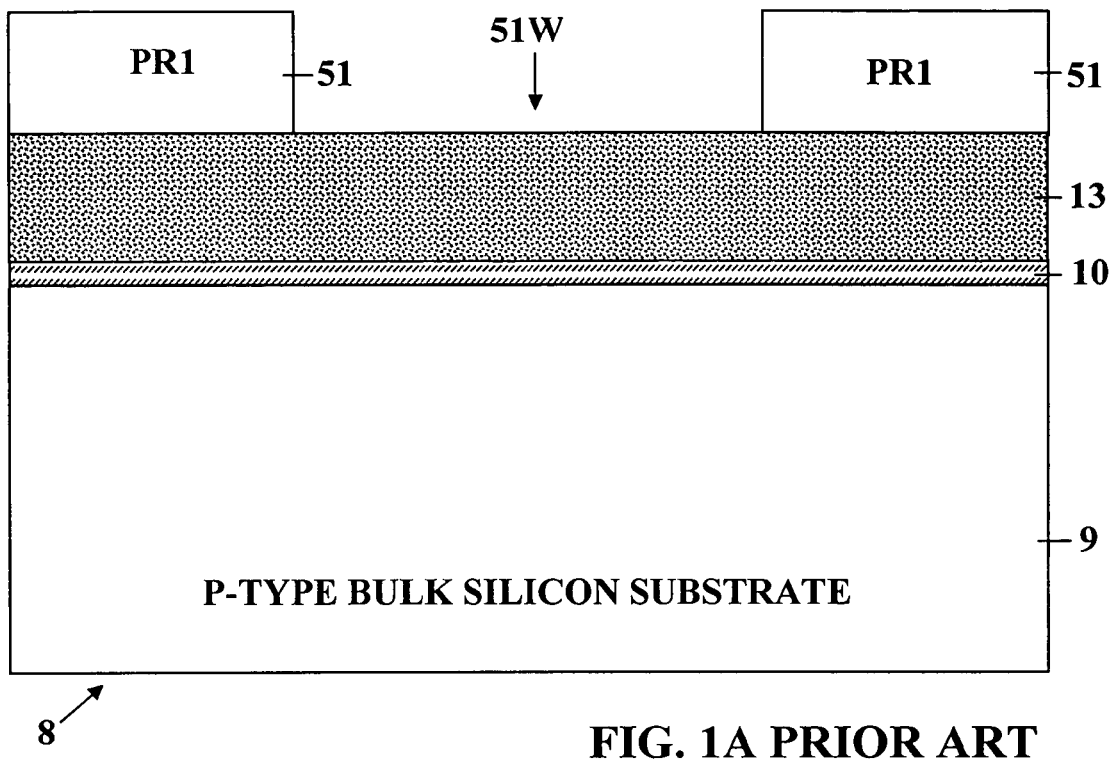
FIGS. 1A–1H illustrate some of the steps of a prior art SSOI process of forming a vertical trench in a silicon semiconductor substrate with lateral trenches aside from the vertical trench.
Figure 1B:
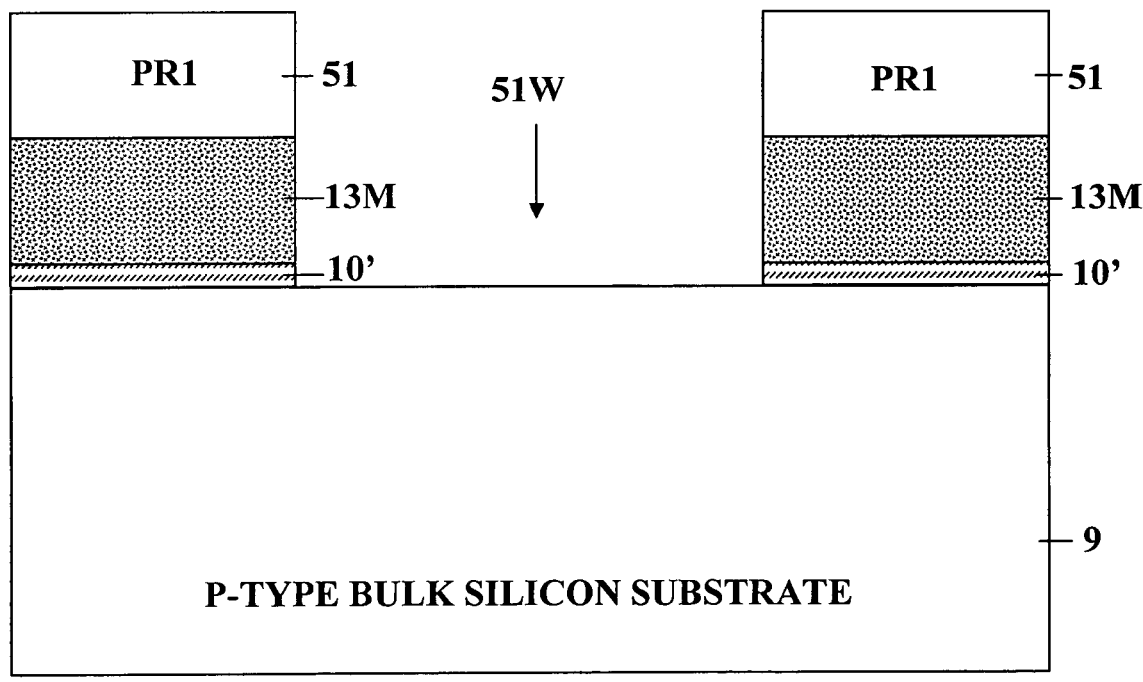
Figure 1C:
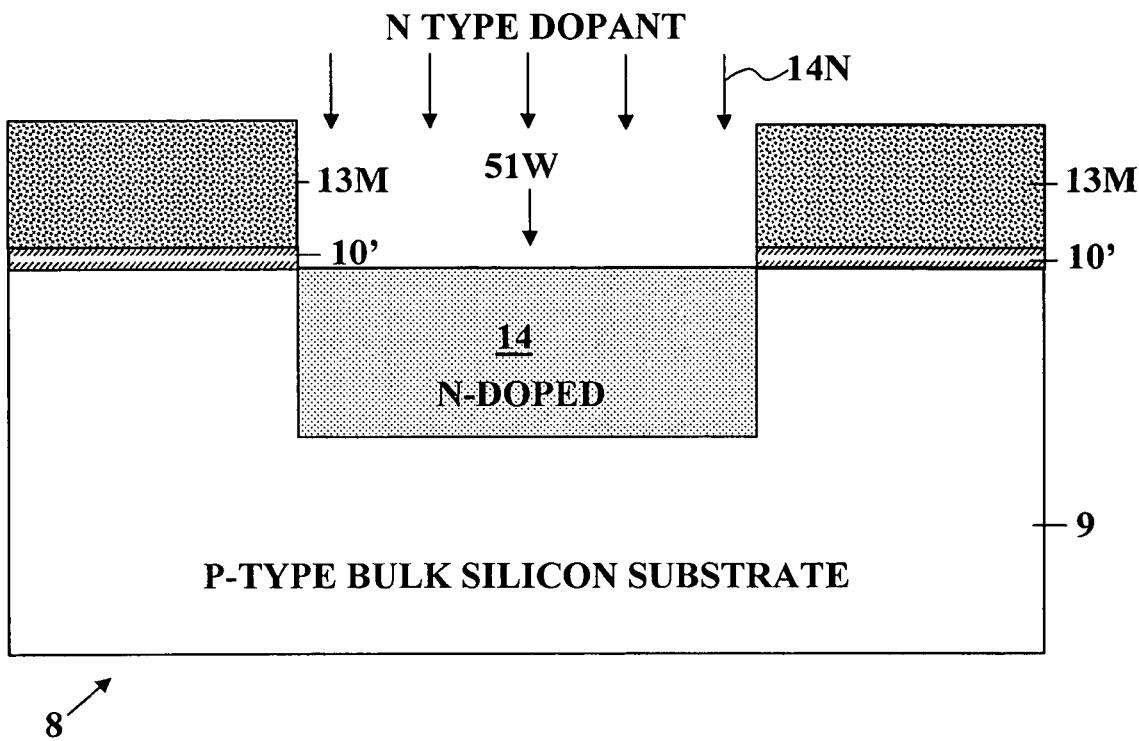
Figure 1D:
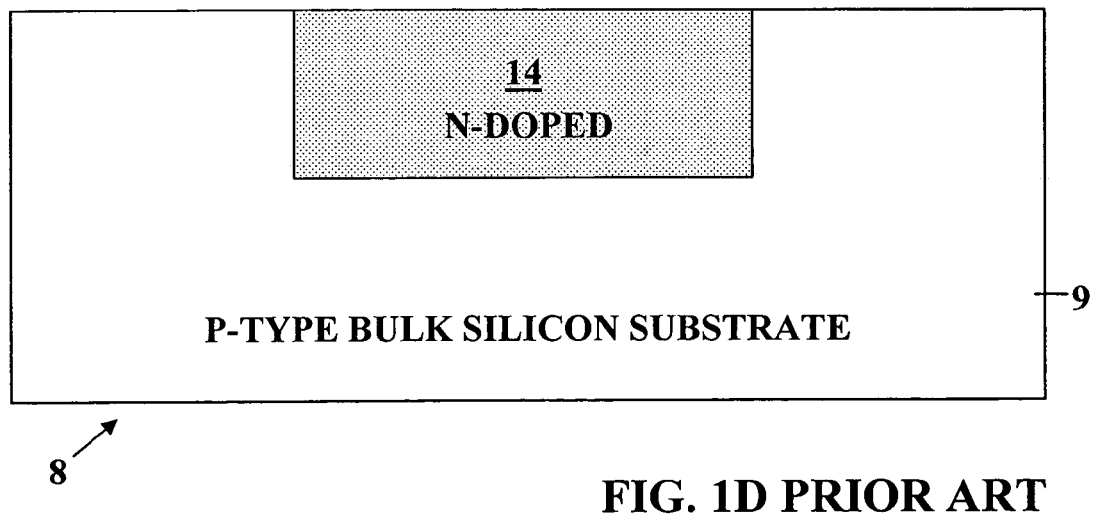
Figure 1E:
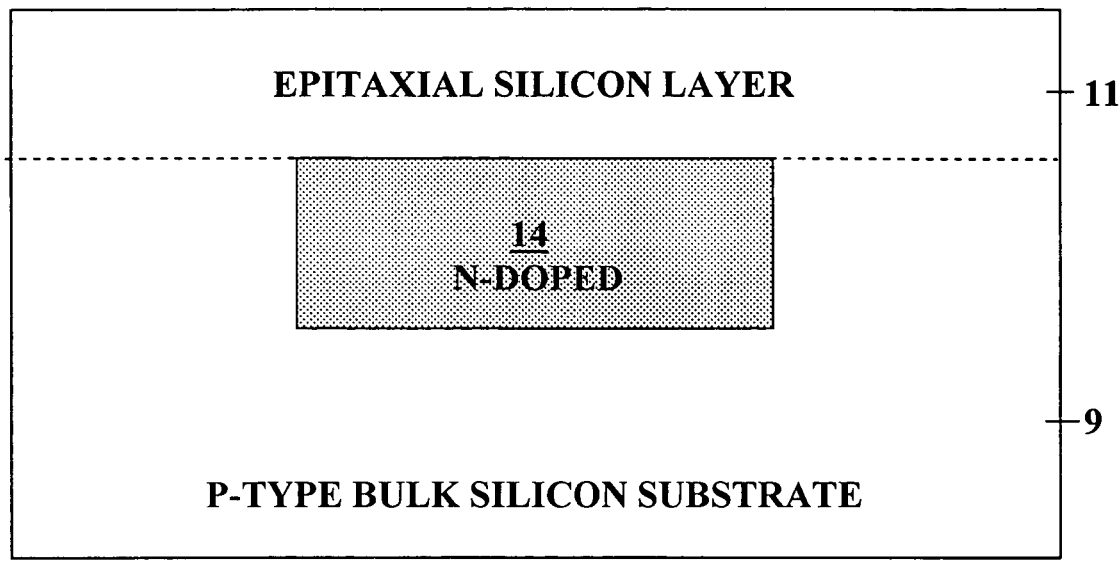
Figure 1F:
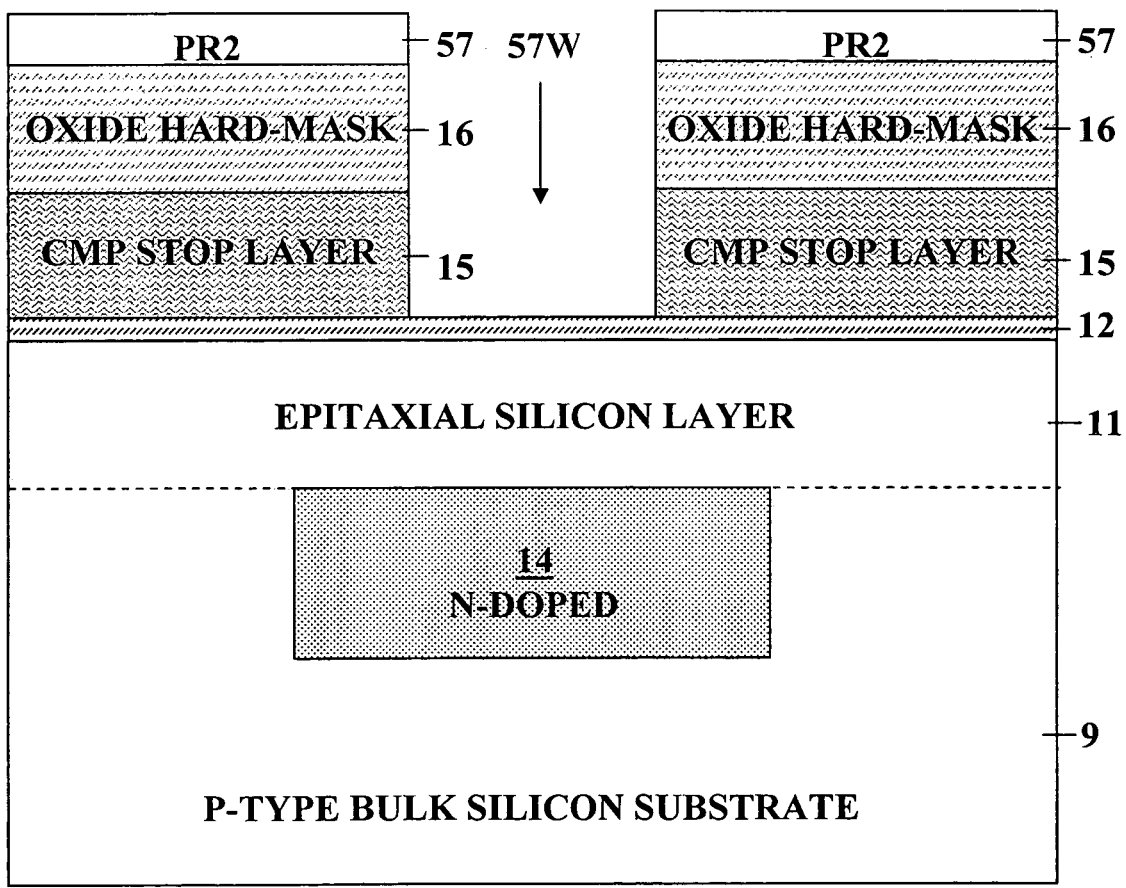
Figure 1G:
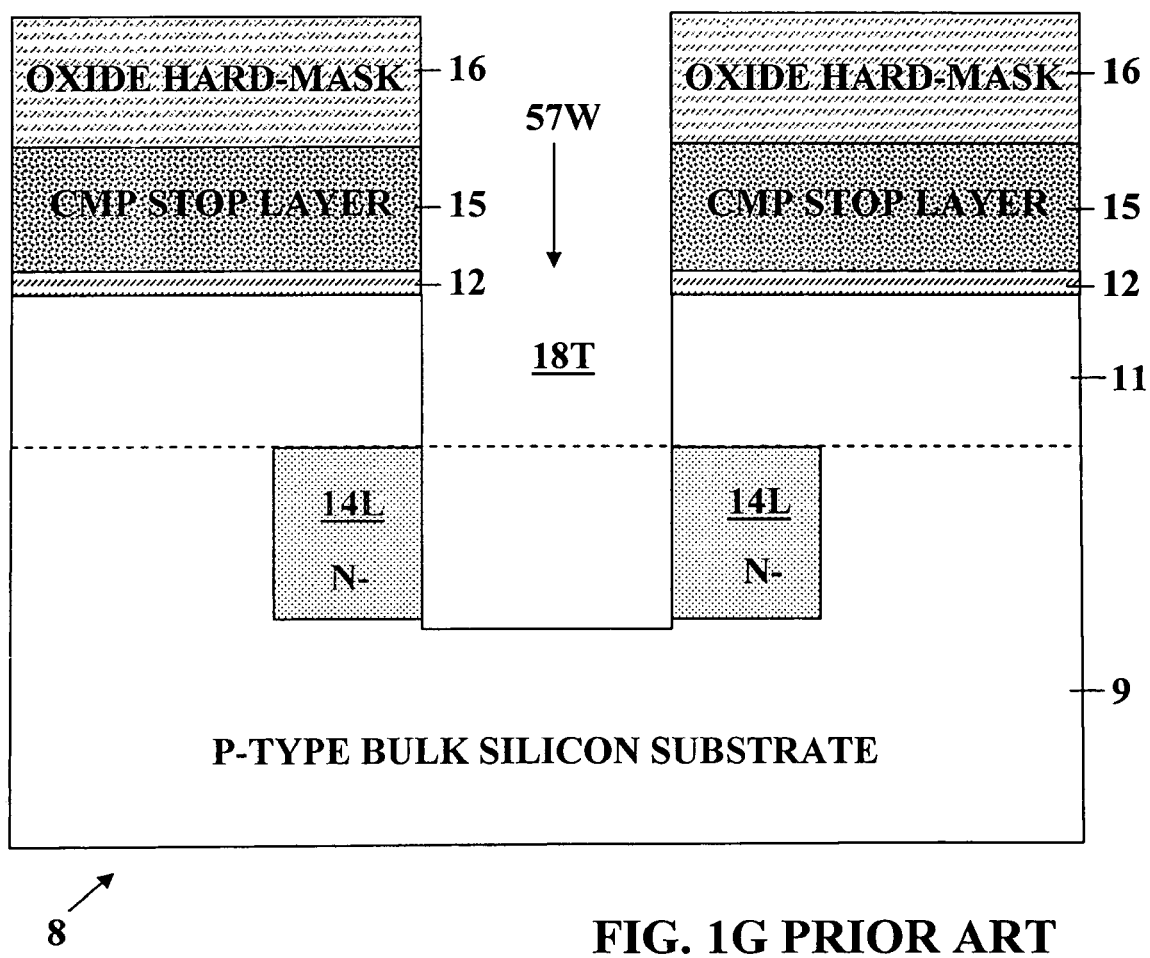
Figure 1H:
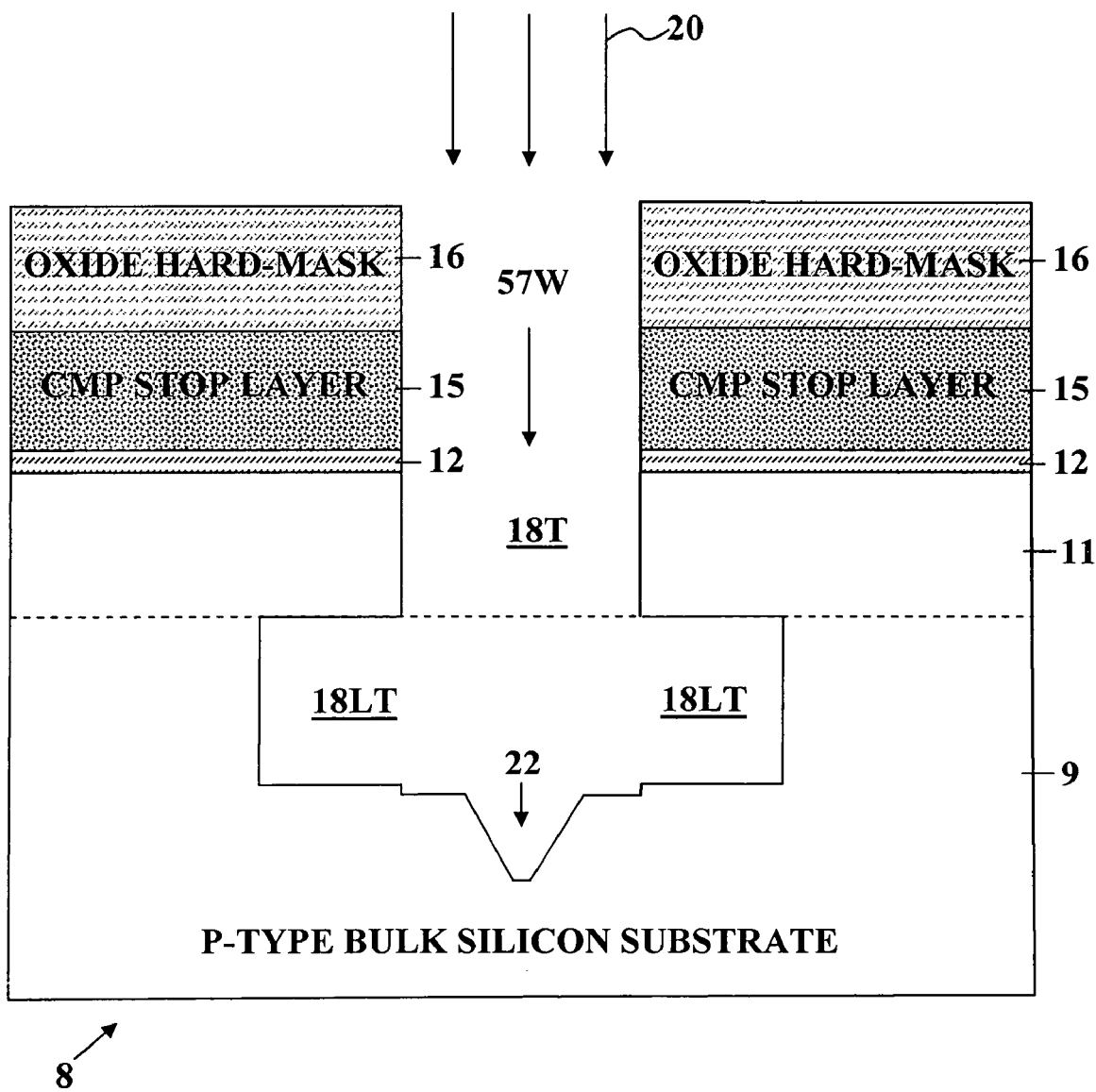
Figure 2A:
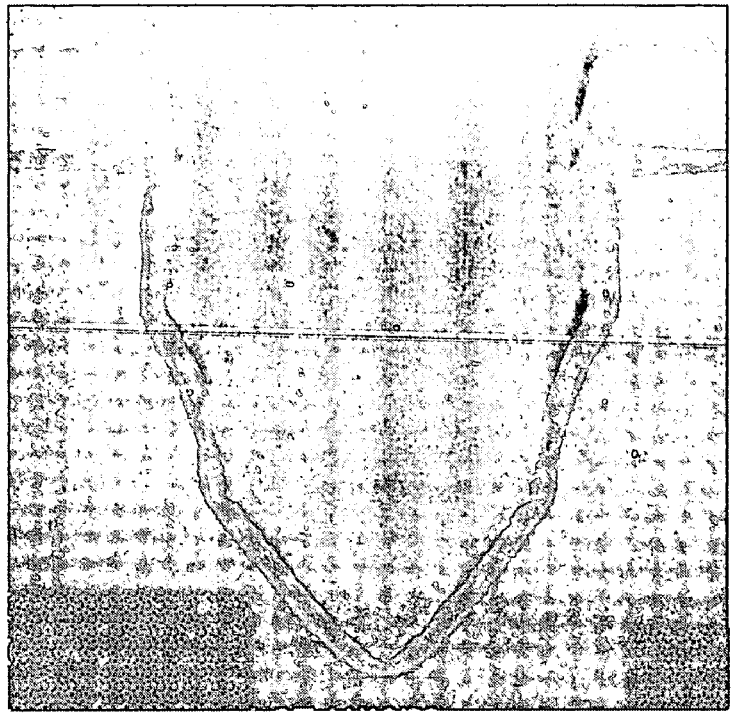
FIG. 2A shows a photo-micrograph of a semiconductor device after formation of a vertical trench the prior art anisotropic etching process as indicated in FIG. 1G.
Figure 2B:
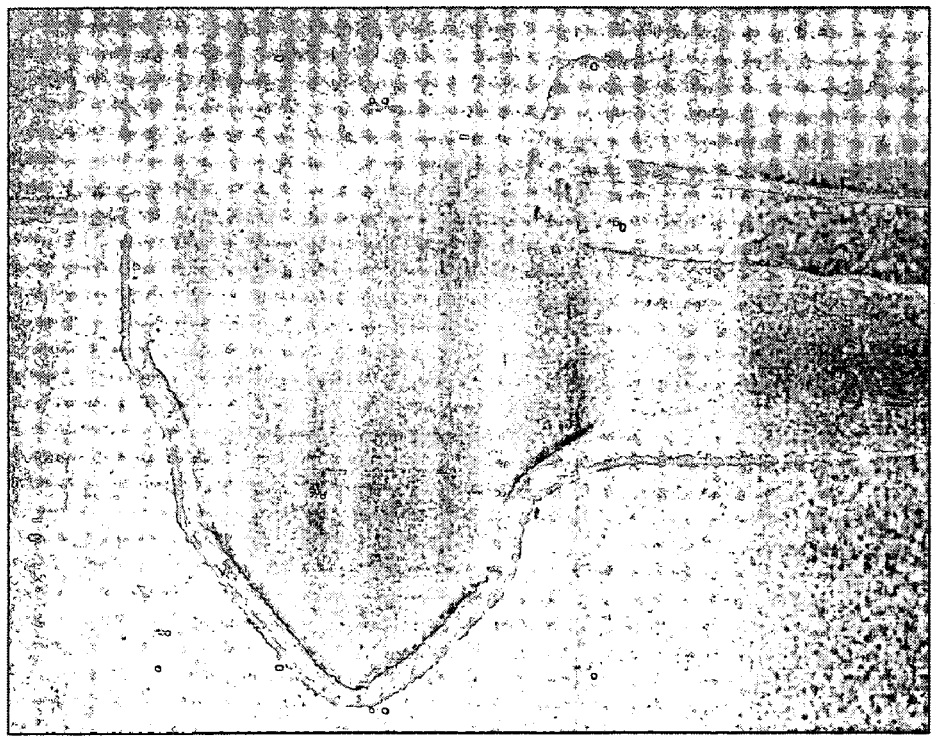
FIG. 2B shows a photo-micrograph of a semiconductor device after formation of a vertical trench with a lateral trench on the right side thereof by the prior art isotropic etching process and ion bombardment as indicated in FIG. 1H. It can be seen that the pattern produced deviates significantly from the idealized pattern shown in FIG. 1H.
Figure 3A:
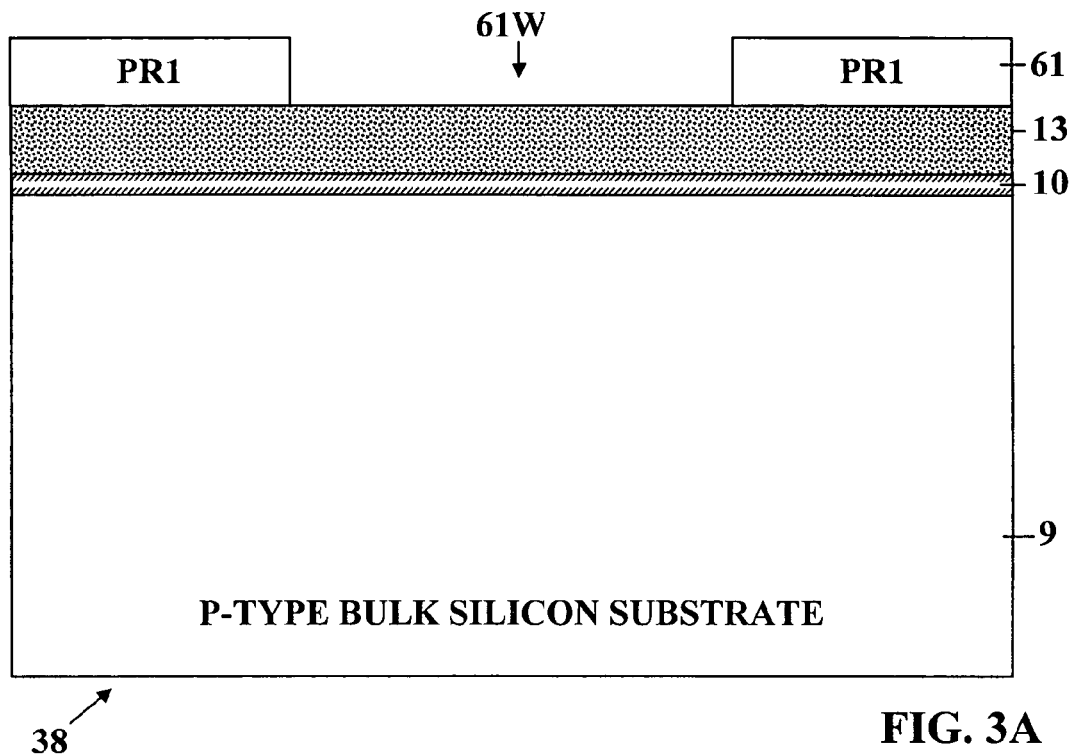
FIGS. 3A–3K illustrate some of the processing steps for preparation steps in accordance with the method of this invention.

Referring to FIG. 3A, as in FIG. 1A, the first step in forming the device 38 starts with a bulk monocrystalline silicon substrate 9 which has been lightly doped with a dopant, preferably a P-type dopant, although it could be N-type dopant. Then the top surface of the substrate 9 is blanketed with a pad layer 10, preferably composed of silicon oxide ($SiO_2$). This step is indicated by block 71 in FIG. 4A. Then a pad nitride layer 13 (silicon nitride ($Si_3N_4$)) was deposited as a blanket onto the pad oxide film 10. This step is indicated by block 72 in FIG. 4A. Next a photoresist (PR1) mask 61 was formed on the surface of the blanket, pad nitride layer 13. The PR1 mask 61 has been patterned photolithographically with a window(s) 61W therethrough exposing a portion(s) of the top surface of the blanket pad nitride layer 13. This is indicated by block 73 in FIG. 4A

In summary, the PR1 mask 61 (e.g. a patterned layer of photoresist) with a window 61W therethrough is formed over implant mask layer 13M. Windows 61W are etched into the implant mask material 13. The photoresist mask 61 is then removed. The exposed portion of the pad oxide layer 10 may also be removed using a well known chemical variant of hydrofluoric acid (i.e. dilute hydrofluoric acid (in variable dilutions), buffered hydrofluoric acid, etc.).

Figure 3B:
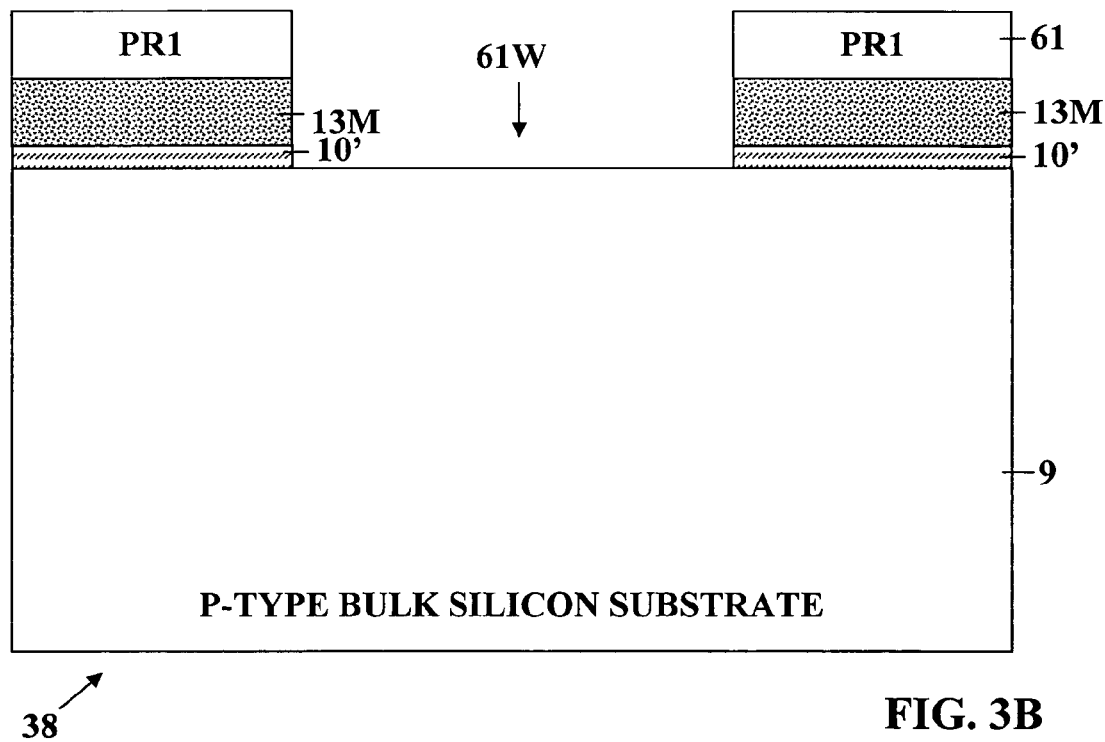
Figure 3C:
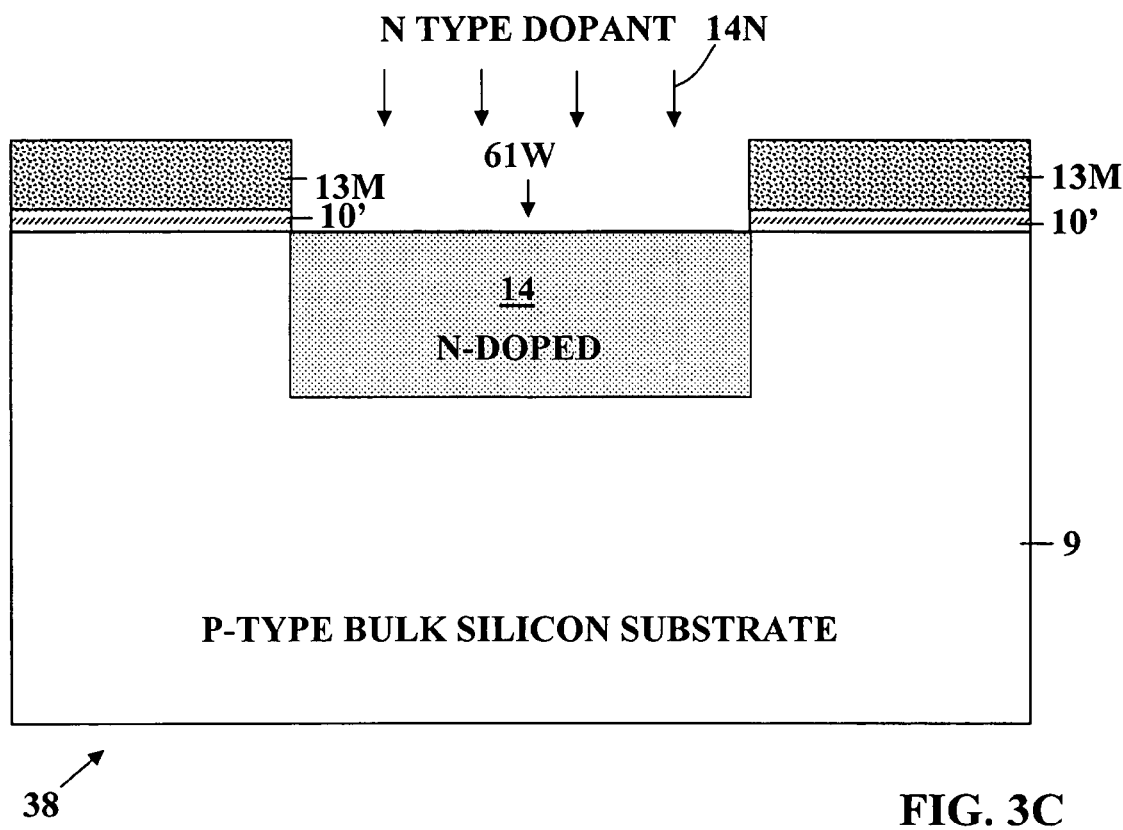

FIG. 3B shows the device 38 of FIG. 3A after the window 61W has been extended down to the top surface of the substrate 9 by etching an opening(s) through the pad nitride 13 layer, thereby forming a patterned implant mask 13M, followed by etching an opening(s) through the pad oxide film 10 to create a patterned pad oxide structure 10' with the window 61W extending therethrough down to expose the top surface of the substrate 9. Opening of the window 61W through the pad oxide layer 10 at this point is an option which may be deferred until after implantation of ions 14N as illustrated in FIG. 3C. This step is indicated by block 74 in FIG. 4A.

Figure 3K:
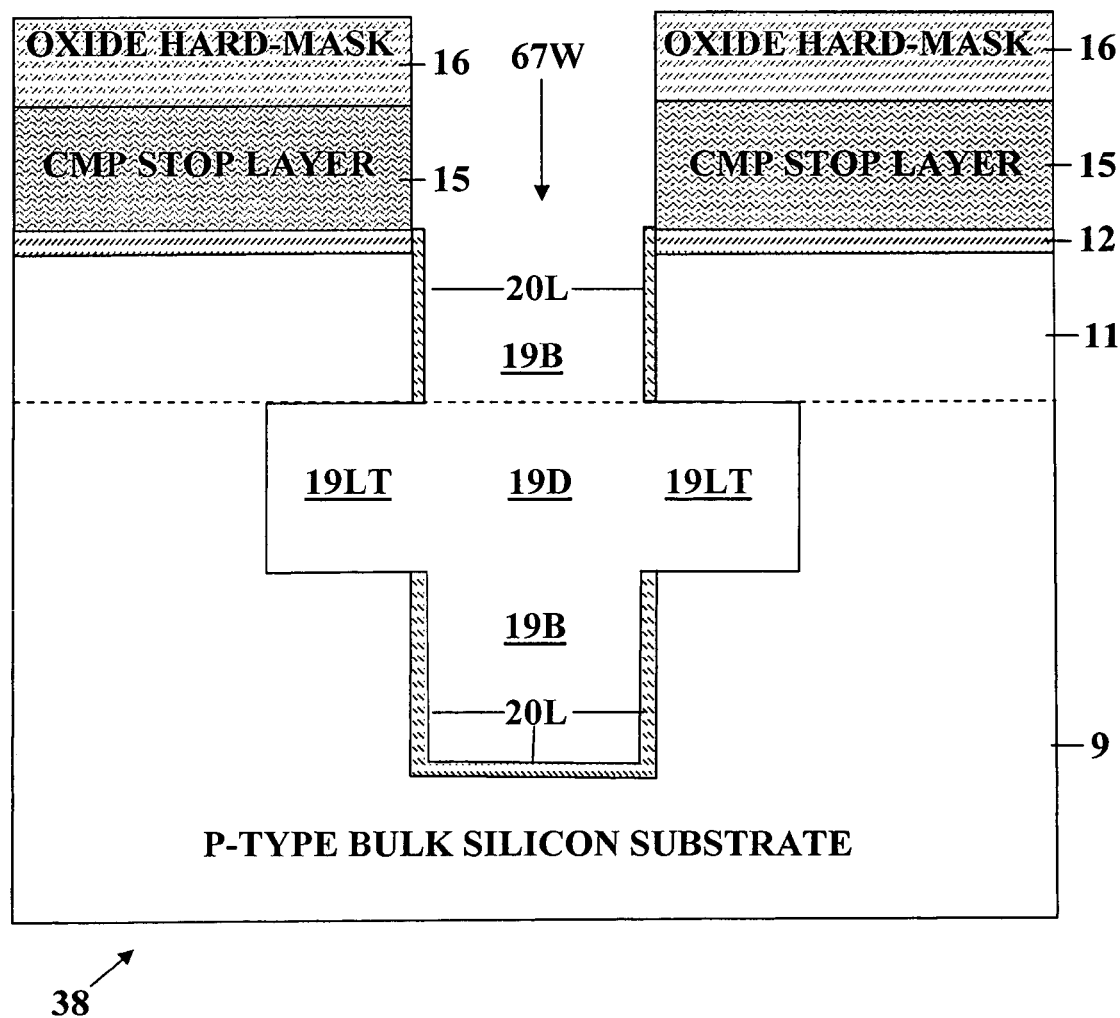
Figure 4A:
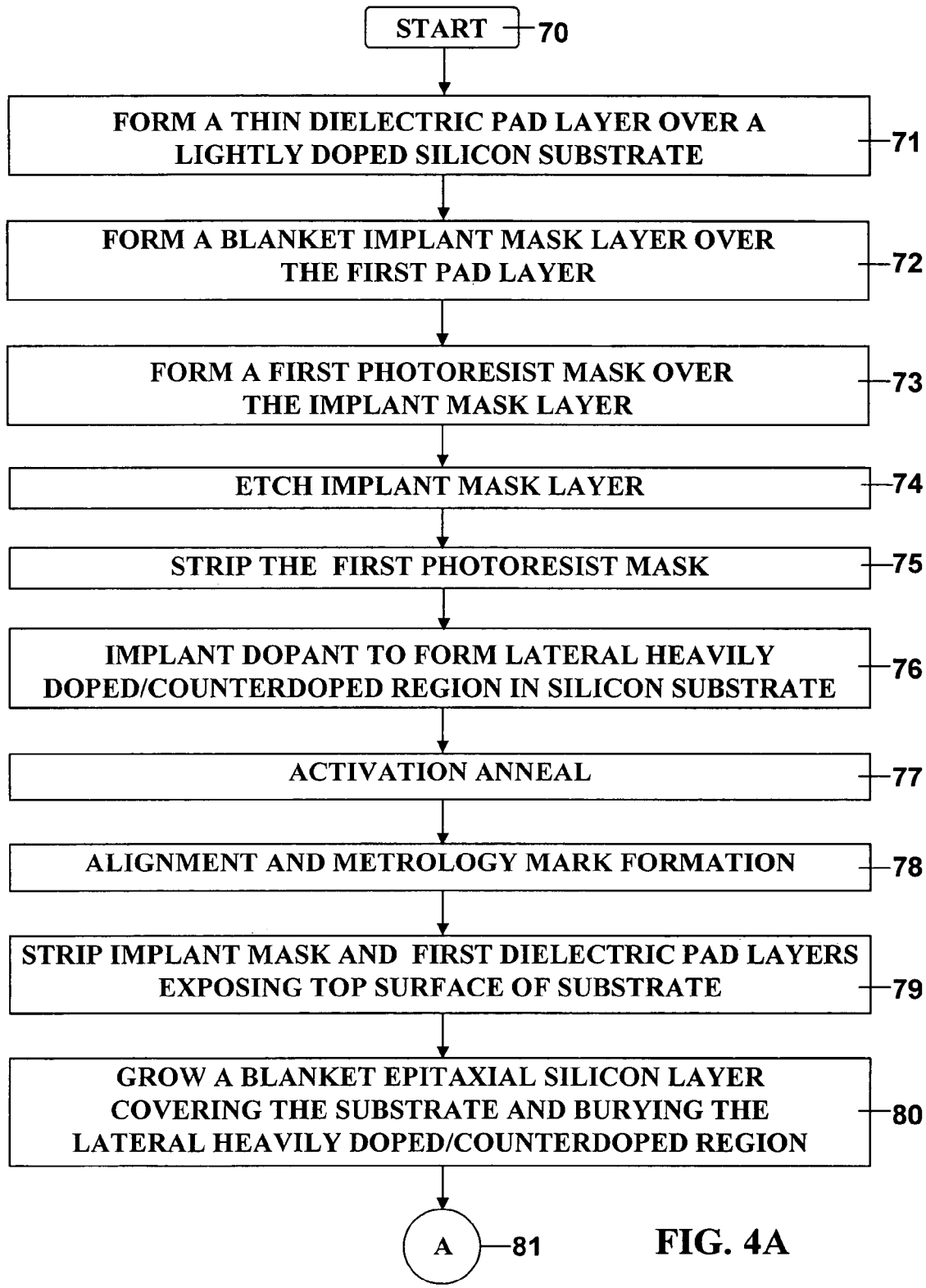
FIGS. 4A and 4B show a flow chart of the process of FIGS. 3A–3K.

FIG. 3C shows the device 38 of FIG. 3B after stripping the photoresist mask 61 as indicated by block 75 in FIG. 4A. FIG. 3C also shows substrate 9 after formation of a lateral heavily doped or preferably counterdoped heavily doped lateral region(s) 14 (doped with N-type dopant). The heavily doped lateral region(s) 14 extends to a shallow depth in the surface of the substrate 9. The lateral, heavily N− counterdoped (P− doped), region 14 shown in FIG. 3C is (are) formed at the surface of the exposed substrate 9, where a lateral trench(es) is to be formed in preparation for creation of a lateral isolation region(s) of the kind shown in FIG. 3K. As stated above, the term Lateral Isolation Region refers to a nonconducting volume within a semiconductor substrate to be filled with an isolating dielectric material that defines the bottom border of device source/drain (S/D) regions. In FIG. 3C a heavy dose of dopant ions 14N (preferably N type dopant) are shown being implanted into and just below the top surface of the substrate 9 to a shallow depth, as described in U.S. patent application Ser. No. 10/604,102 of Steegan et al., the teachings of which are incorporated herein by reference.

This implanted lateral heavily doped layer 14 is intended to extend into the substrate 9 including the first approximately 1000 Å of the exposed portion of the bulk monocrystalline, silicon substrate 9. Next, the counterdoped species of dopant 14N (e.g. N+ species if the substrate is P− doped) are activated through Rapid Thermal Anneal (RTA) at a temperature range of from about 950° C. to about 1050° C. Other activation processes may also be used such as a laser annealing process.

Figure 3D:
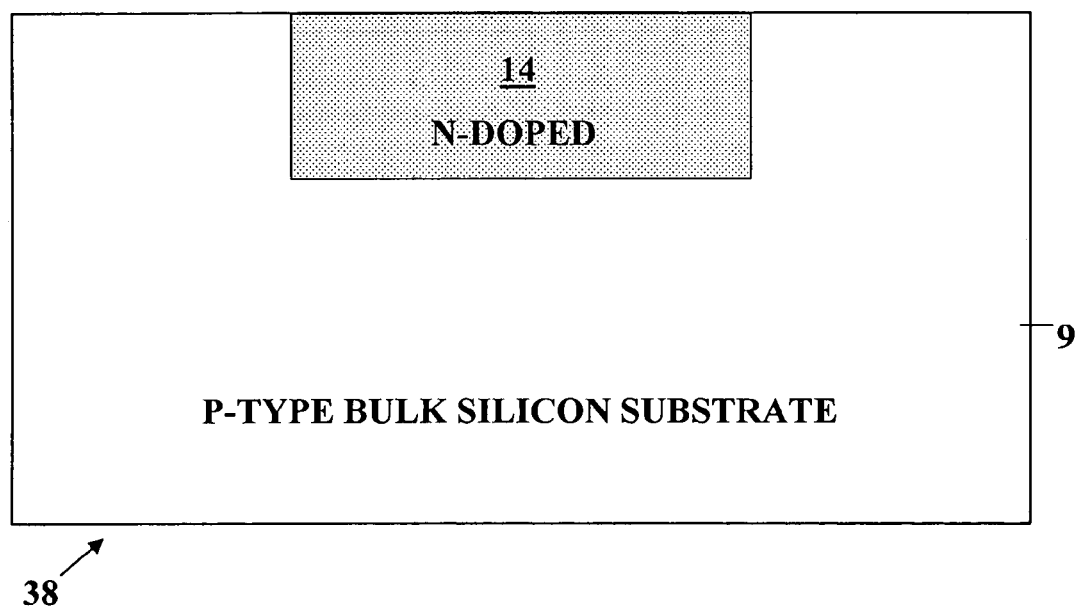

Next, FIG. 3D shows the device 38 of FIG. 3C after the shallow implant of ions 14N has been completed. Appropriate N type dopant includes Arsenic (As), Boron (B), or Antimony (Sb) implanted with a dopant dose within the range from about $1E14\ cm^{-2}$ to about $1E16\ cm^{-2}$, implanted with an implantation energy from about 1 kev to about 10 kev range. This is indicated by block 76 in FIG. 4A.

The shallow ion implantation of ions 14N is followed by a subsequent anneal as indicated by block 77 in FIG. 4A.

Before removing the silicon nitride implant mask 13M, as an option, it is preferable to etch alignment marks for the subsequent lithography level(s) to make it physically invisible to subsequent levels. Therefore all regions expect alignment and measurement sites would be covered with an additional photolithographically patterned photoresist mask (not shown). The wafer is then exposed to a silicon etch. Areas etched are those that are open in both the implant mask and the photoresist. The additional photoresist (not shown) is then removed. The alignment and metrology mark formation step is indicated by block 78 in FIG. 4A.

Finally the remaining implant mask 13M ($Si_3N_4$) and pad oxide 10' ($SiO_2$) are removed leaving only the bulk substrate, i.e. exposing the top surface of substrate 9 including the top surface of the lateral, heavily doped region 14, as indicated by block 79 in FIG. 4A.

Figure 3E:
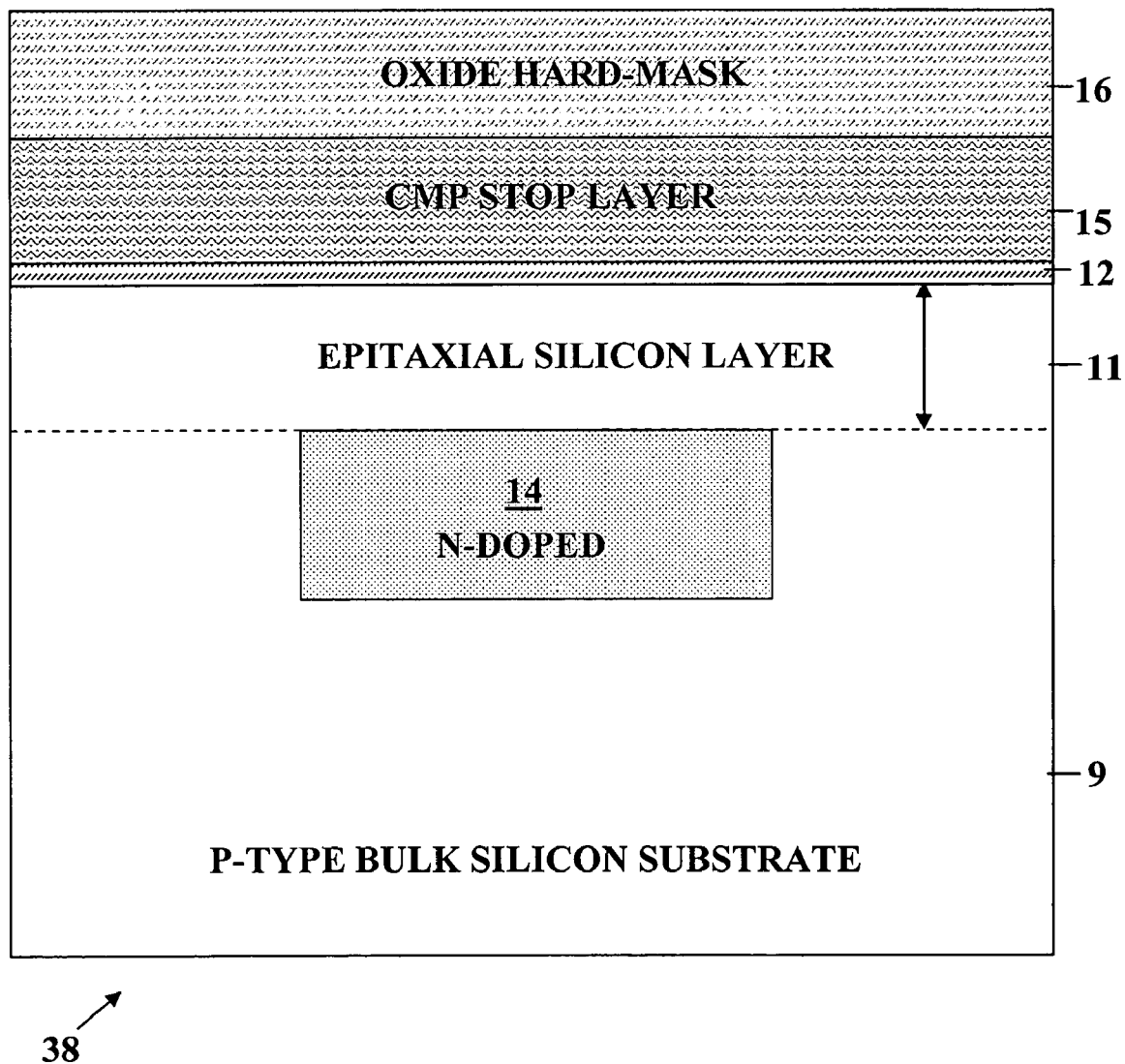

Next, FIG. 3E shows the device 38 of FIG. 3D after a blanket silicon layer 1 (hereinafter referred to as epitaxial silicon layer 11) was grown epitaxially with uniform thickness over the top surface of the substrate 9 of device 38 thereby burying both the lightly-doped substrate 9 and lateral, N– heavily doped region(s) 14, with equal thicknesses of epitaxial silicon. This is indicated by block 80 in FIG. 4A. Note that block 82 in FIG. 4B, follows block 80 in FIG. 4A as indicated by the connectors 81.

Next, still referring to FIG. 3E preparation has begun for formation of features comprising a vertical isolation trench (e.g. trench 19A shown in FIG. 3H) extending down into the bulk silicon substrate 9. First, a pad oxide film 12 is thermally grown on the substrate 9. The pad oxide film 12 is a new pad layer relative to the pad layer 10 that was used to "pad" the implant mask 13M and the bulk silicon substrate 9 in FIG. 3A. The pad oxide film 12 is indicated by block 82 in FIG. 4B. Next, a blanket CMP (Chemical Mechanical Planarization) stop layer 15 is deposited. This is indicated by block 83 in FIG. 4B. Then a blanket silicon oxide hard mask layer 16 is formed covering the pad layer 10. This is indicated by block 84 in FIG. 4B.

Figure 3F:
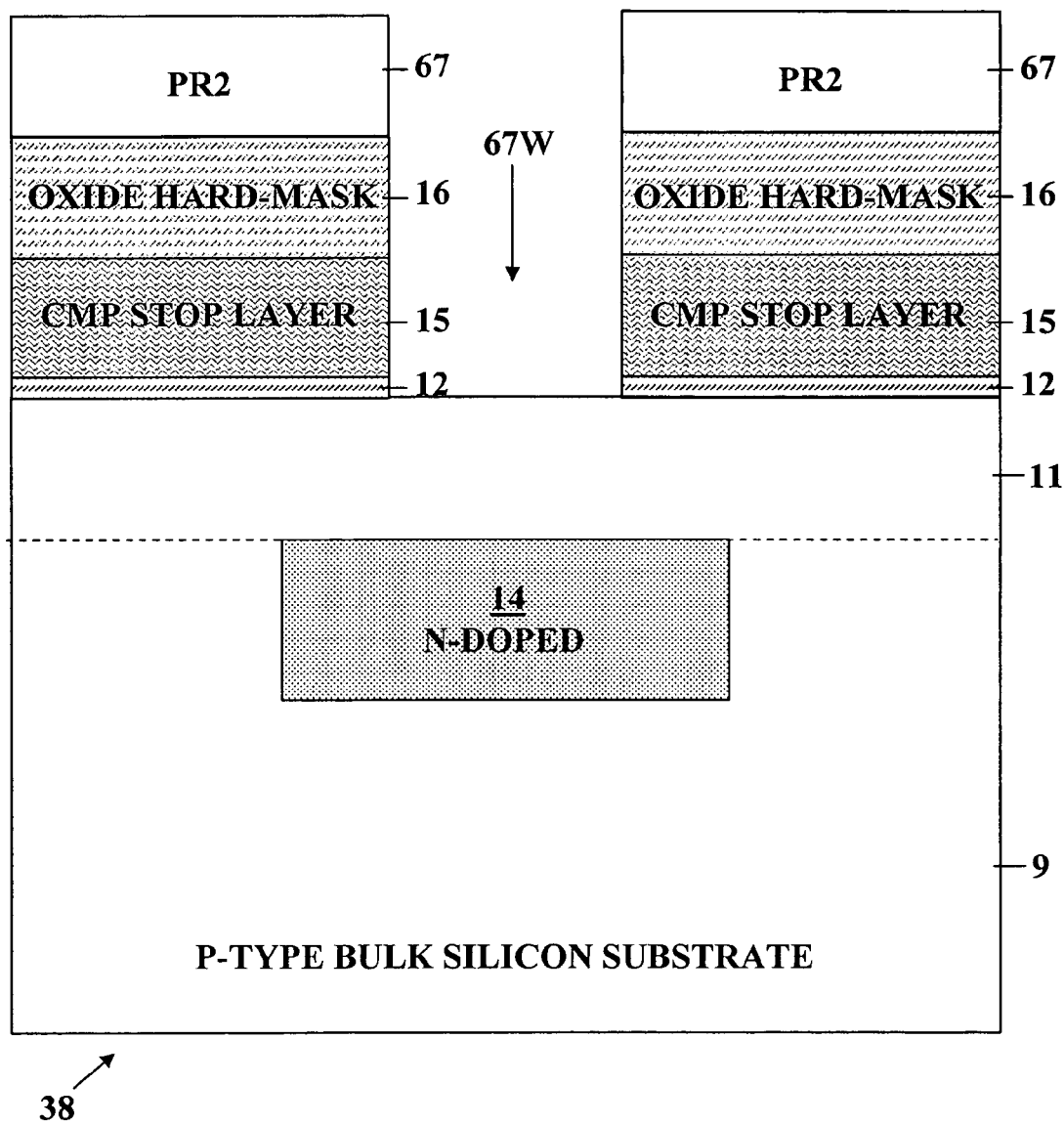

FIG. 3F shows the device 38 of FIG. 3E after covering the oxide hard mask layer 16 with a second, patterned photoresist (PR2) mask 67, which has a window 67W therethrough. This is indicated by block 85 in FIG. 4B. Then, the second, PR2 mask was used to etch through both the hard mask layer 16 and the stop layer 15 and the pad oxide film 12. As a result the window 67W reaches down to expose the top surface of the epitaxial silicon layer 11. Alternatively, the processing in accordance with this invention may delay extension of the etch of window 67W past the exposed pad oxide film 12 delaying the breakthrough thereof, as in FIG. 1F. This is indicated by block 86 in FIG. 4B.

Figure 3G:
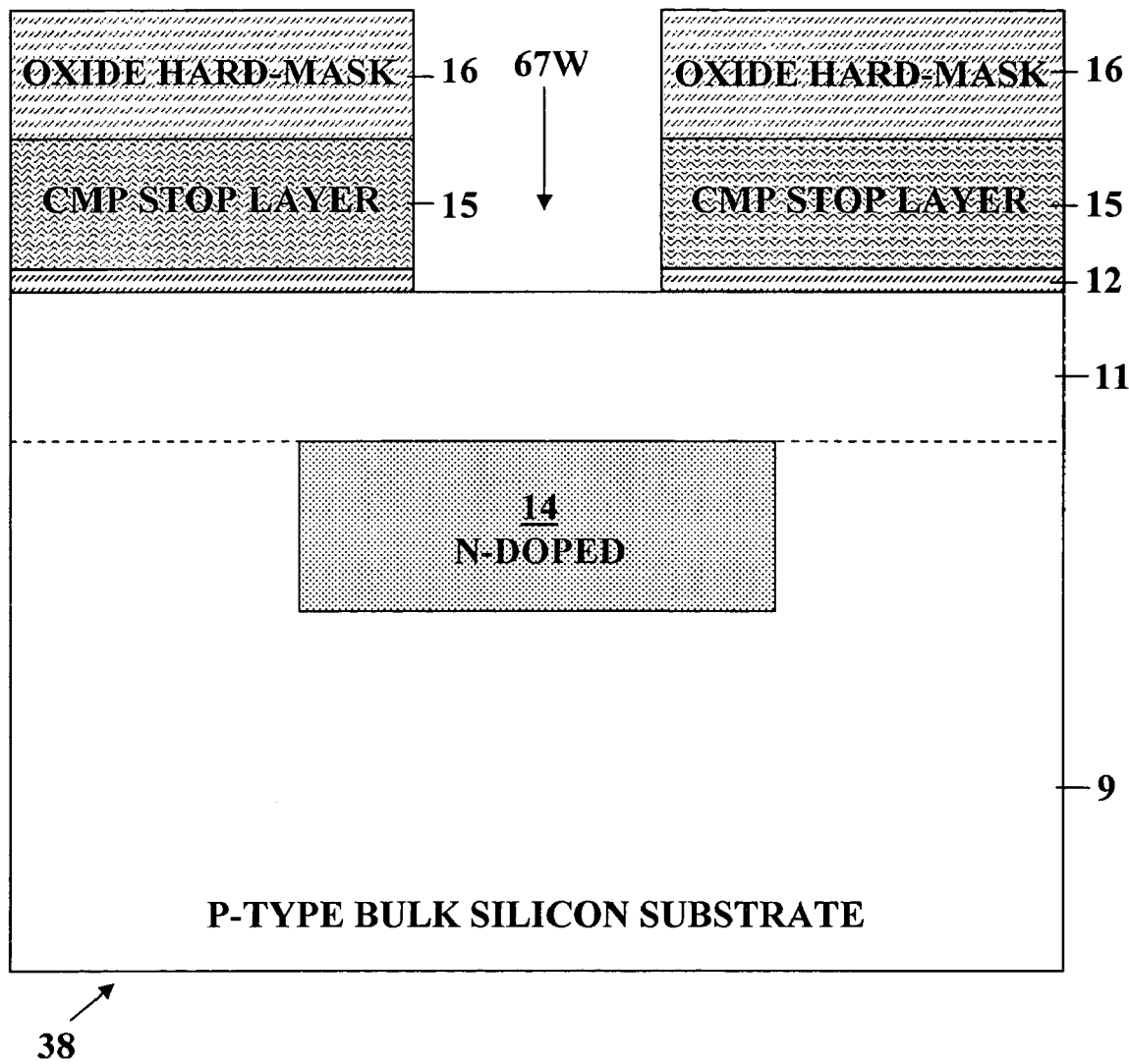

FIG. 3G shows the device 38 of FIG. 3F after the second, PR2 mask 67 has been stripped from the device 38. This is indicated by block 87 in FIG. 4B.

Figure 3H:
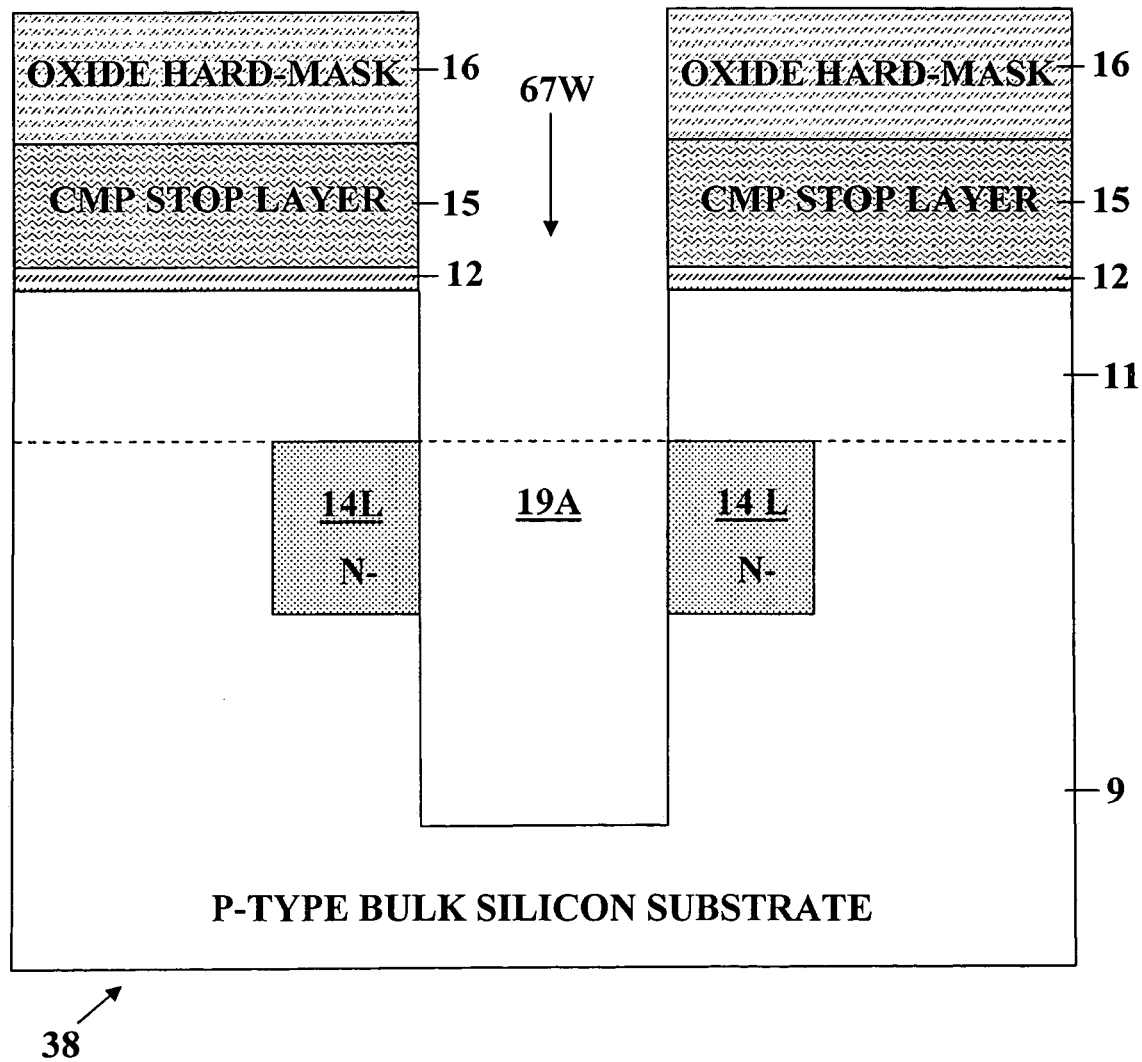

FIG. 3H shows the device 38 of FIG. 3G after etching through the window 67W to open a vertical trench 19A below the pad oxide film 12 extending down through the epitaxial silicon layer 11 and down into the bulk silicon substrate 9. This process step is indicated by block 88 in FIG. 4B. A variation of the present invention from the prior art is the fact that the vertical RIE etching process, in accordance with this invention, continues through the buried heavily doped silicon lateral regions 14 to the final depth of the vertical trench 19A in a single pass. Again the final depth of the trench 19A is a requirement of conventional bulk CMOS devices which would inevitably co-exist on product as the SSOI CMOS devices. The etching continues down into the bulk silicon substrate 9 to form the vertical isolation trench 19A aligned to intersect with and bisect the lateral heavily doped or counterdoped region(s) 14 into lateral regions 14L extending from the sidewalls of the trench 19A. The anisotropic, vertical etching continues after it has extended down to bisect the lateral heavily doped region(s) 14 (extending therethrough) forming, heavily doped lateral regions 14L aside from the trench 19A. Preferably the vertical isolation trenches 19A are formed in the bulk silicon substrate 9 by Reactive Ion Etching (RIE). The vertical isolation trench(es) 19A intersect with the lateral heavily doped/counterdoped buried region(s) 14 because they are aligned therewith vertically. Vertical alignment of the isolation trench 19A with the lateral region(s) 14 in the substrate 9 is critically important since it is necessary in order for there to be to buried region(s) 14L in preparation for removal of the remainder of the heavily doped material in the lateral regions 14L in the silicon semiconductor substrate 9.

Figure 3I:
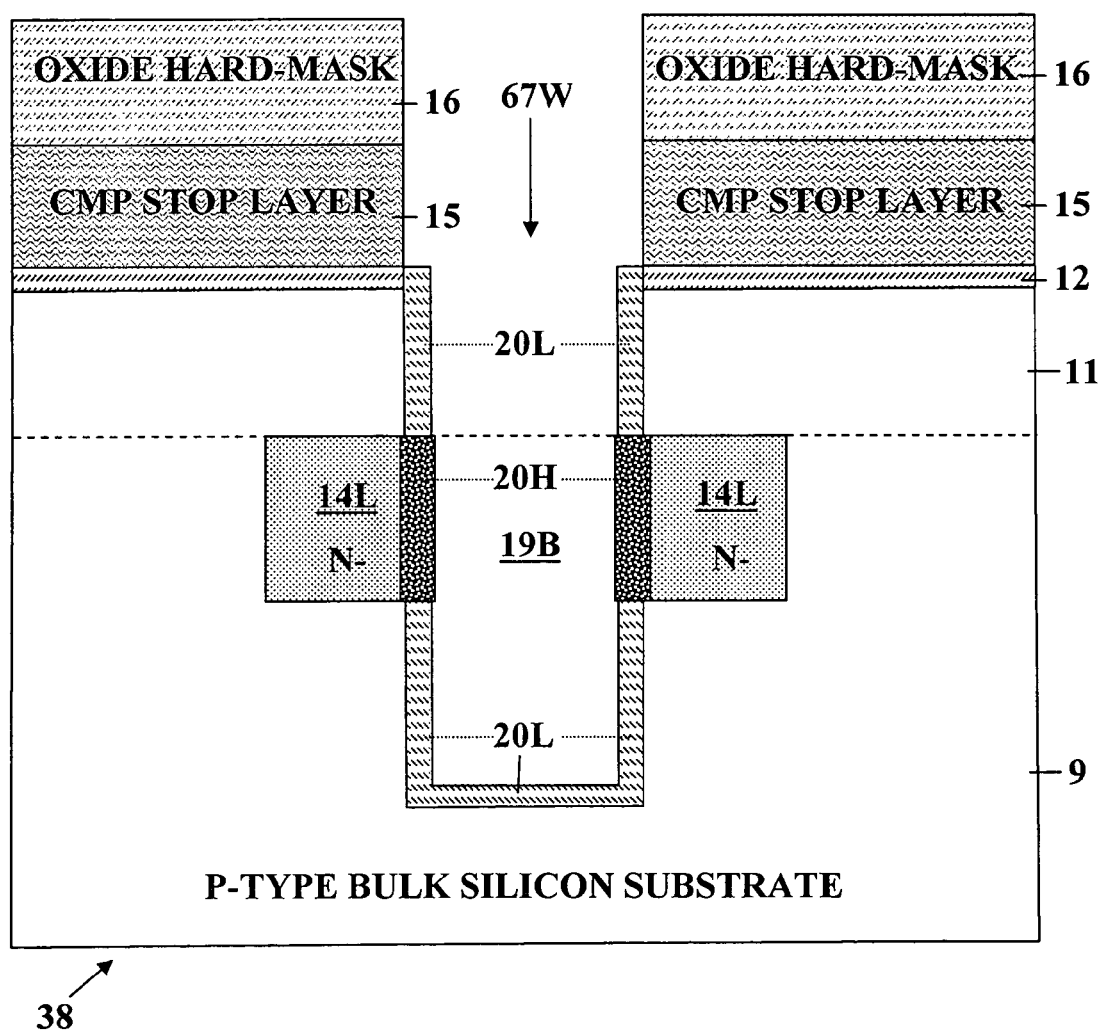
Figure 4B:
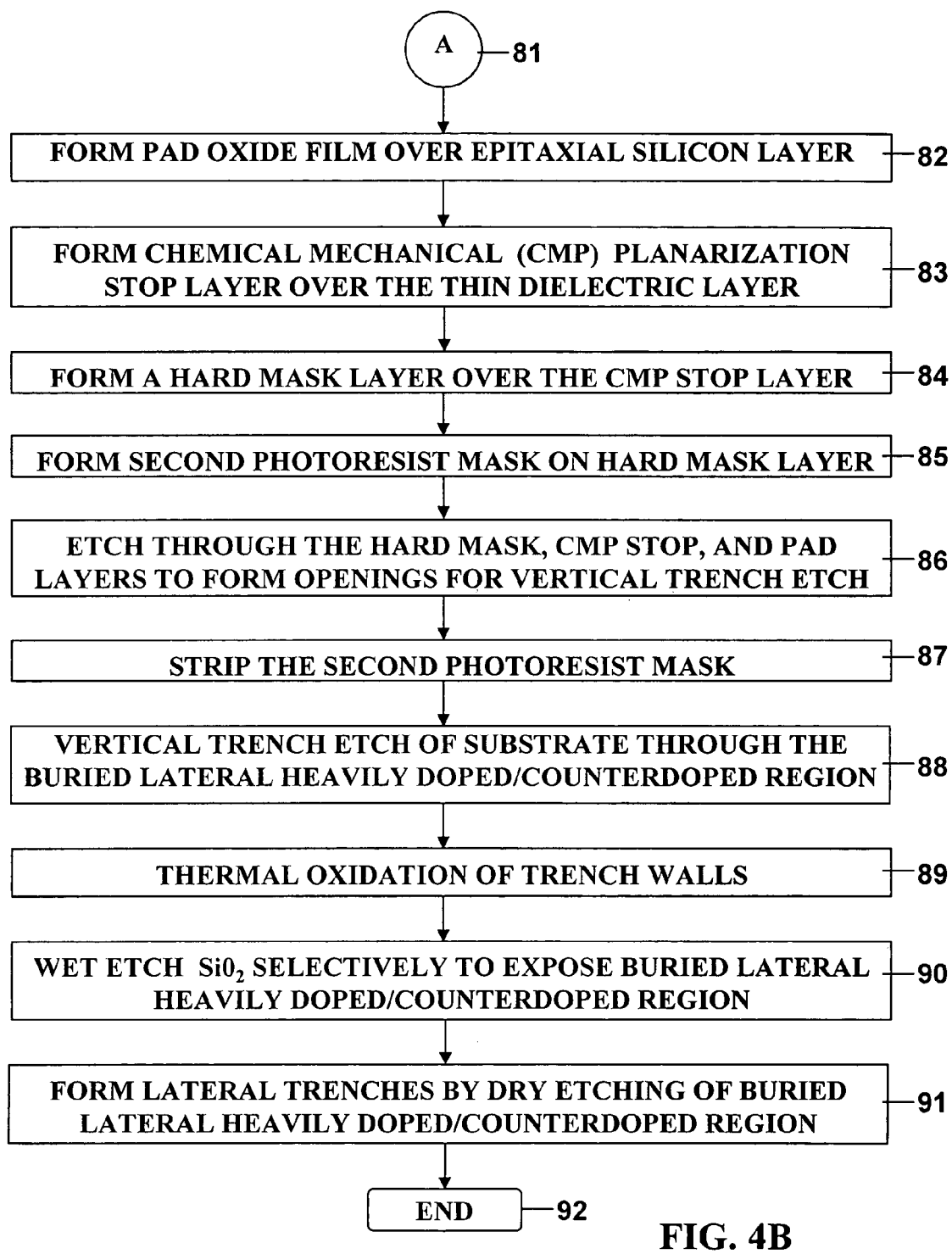

FIG. 3I shows the device 38 of FIG. 3H, after the device 38 has been subjected to thermal oxidation which forms a passivating silicon oxide layer 20L on the sidewall and bottom surface areas of the lightly doped walls and bottom of the trench 19A that are to be retained, as indicated by block 89 in FIG. 4B. The thermal oxidation of the exposed sidewalls of the bisected, heavily doped regions 14L yields a thicker silicon oxide layer 20H which is also grown on the exposed sidewall surfaces of the bisected, heavily doped, silicon lateral regions 14L in the trench 19A. The thermal oxidation is performed within a temperature range from about 900° C. to 1100° C. in an atmospheric range from about 0.1 atm to 3 atm.

It is probable that layer 20H will be thicker than layer 20L which may counter the advantage of the elevated wet-etch rate of 20H. Oxidation and implant conditions must be carefully selected to minimize the difference in thickness. It may even require additional implant species which would retard the oxidation rate in the buried N-doped region (i.e. a low nitrogen dose in the range of $1E11\ cm^{-2}$ to $1E13\ cm^{-2}$).

Figure 3J:
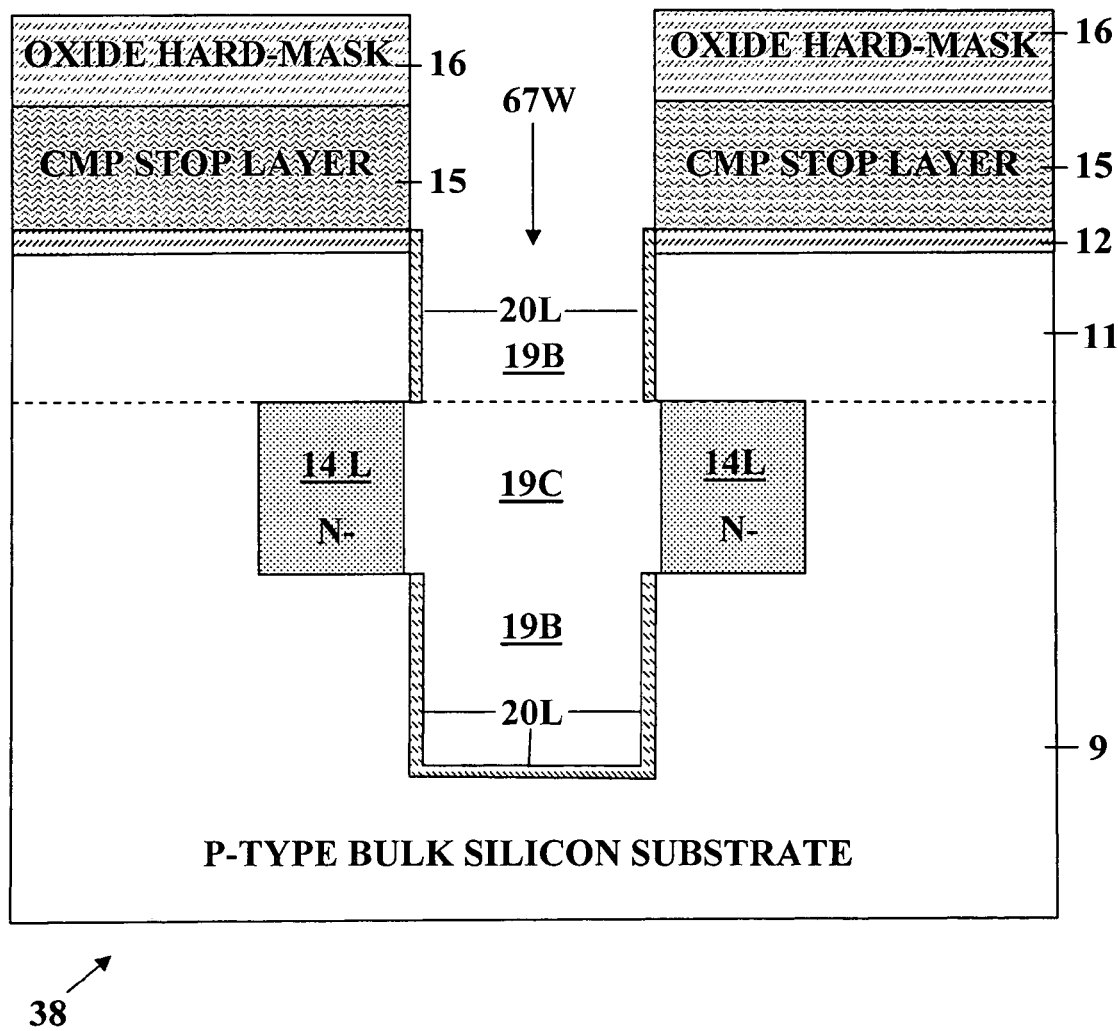

FIG. 3J shows the device 38 of FIG. 3I after the device 38 was exposed to a form of selective etching which will remove the highly doped silicon oxide 20H grown over the heavily doped lateral regions 14L at a higher rate than that grown over the lightly doped or undoped bulk silicon semiconductor region 11. This selective etching process is intended to uncover the sidewalls (inner edges in the trench 19B) of the buried doped lateral regions 14L while retaining the passivating silicon oxide film 20L that was grown over undoped regions. Hydrofluoric acid-based wet etch chemistry is preferably employed for this purpose of etching the more heavily doped silicon dioxide layer 20H, selectively over the less heavily doped layer 20L as indicated by block 90 in FIG. 4B.

FIG. 3K illustrates the post lateral RIE device 38 of FIG. 3J after the step of lateral isotropic RIE etching to empty out the lateral heavily doped or counterdoped lateral regions 14L to form the lateral trenches 19LT. As shown by FIG. 3G the lateral isotropic RIE etch of the device 38 of FIG. 3F removes the exposed doped silicon of the bisected lateral regions 14L preferentially over lightly doped silicon oxide ($SiO$ or $SiO_2$) layer 20L and lightly or undoped silicon in the bulk substrate 9, which is uncovered as the isotropic lateral RIE continues through the bisected, heavily doped regions 14L until they are completely hollowed out forming empty lateral trenches 19LT which extend laterally from the vertical trench 19D which remains lined with the lightly doped or undoped, passivating, silicon oxide film 20L, preferably employing a high-pressure chlorine and/or bromine-based plasma in the isotropic lateral RIE etching process. Selectivity between undoped silicon and N-doped silicon may be as high as 500:1. The RIE process of FIG. 3K is indicated by block 90 in FIG. 4B.

Options Process Step

At this point in the process flow, the current state-of-the-art and this invention are very similar with the exception is that there is an option of introduction of nitrogen into the buried doped layer as described below in the detailed description of an optional process.

A mechanism that can work against the premise of this invention is the fact that the oxidation rate of doped silicon is typically enhanced especially for commonly used dopants such as boron (P-type or Group III) as well as arsenic, phosphorus and antimony which are N-type or Group IV as described in References 1, 2, and 3 above. Mechanisms leading to enhanced oxidation rate vary. To counter these mechanisms, selection of several parameters must be carefully considered as follows:

(a) Dopants for both the substrate (background concentration) and lateral trench dopant type as well as their respective concentrations relative to one another. For the lateral region, use either arsenic (As), phosphorus (P) or antimony (Sb). One of these may be less susceptible to elevated oxidation rate. One may be better than the others as well for re-incorporation into the thermal oxide.

There is an additional option of introducing a small quantity of nitrogen into the doped layer in order to retard the oxidation rate of the doped layer.

The requirements for this process are such that they do not interfere with the initial epitaxial silicon growth and they do not interfere with the lateral RIE process. One starts with a relatively large range of nitrogen doses (1E11 $cm^{-2}$ to 1E13 $cm^{-2}$) with an energy range which provides a dopant profile that is completely contained within the doped layer (½ of the energy used for the N+ implant: 500 eV to 1 KeV is reasonable).

As described in Wolf and Tauber, cited above, one selects conditions that minimize the reaction-controlled oxidation regime in order to run in the diffusion-limited oxidation regime as early in the process as possible. This should minimize the thickness delta.

Reviewing the steps of FIGS. 3J–3K, the first portion of the lateral etching process includes the complete formation of a vertical isolation trench 19B which includes etching through the doped epitaxial layer 20H followed by etching away the heavily doped lateral regions 14. For this process to work, it is crucial that the vertical isolation trench 19A intersects and exposes that lateral doped region 14.

The second stage of isolation etching serves the purpose of etching the lateral (doped) silicon 14 preferentially over the undoped or lightly doped portions of the bulk semiconductor substrate 9.

FIGS. 4A and 4B show the flow chart of the process of FIGS. 3A–3K.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the following claims.

Having thus described the invention, what is claimed as new and desirable to be secured by Letters Patent is as follows:

1. A method of forming a lateral trench in a semiconductor substrate comprising the steps as follows:

formation of a lateral implant mask over a top surface of the semiconductor substrate;

implanting a heavy concentration of dopant into the substrate through the lateral implant mask forming a lateral implant region in the substrate;

stripping the lateral implant mask exposing the top surface of the substrate; formation of an epitaxial silicon layer over the top surface of the substrate burying the lateral implant region;

formation of a trench mask over the epitaxial layer;

etching a trench reaching through the epitaxial layer and the lateral implant region;

formation of oxidized trench sidewalls, an oxidized trench bottom and oxidized sidewalls of the lateral implant region;

etching the oxidized sidewalls of the lateral implant region until the lateral implant region is exposed; and formation of a laterally extending trench in the substrate by etching the lateral implant region.

2. The method of claim 1 including performing the steps prior to formation of the implant mask comprising:

formation of a blanket thin dielectric pad layer and a blanket implant mask layer over the substrate in that order;

formation of a first photoresist mask with a pattern over the blanket implant mask layer;

etching the pattern in the first photoresist mask into the blanket implant mask layer; and stripping the first photoresist mask.

3. The method of claim 1 including performing the step of implanting a heavy concentration of dopant into the substrate through the lateral implant mask forming a lateral implant region in the substrate following the formation of the implant mask.

4. The method of claim 3 including performing the step of performing an activation anneal immediately after implanting the heavy concentration of dopant into the substrate through the lateral implant mask.

5. The method of claim 4 includinig performing the step of stripping the implant mask subsequent to the activation anneal and prior to forming the epitaxial silicon layer.

6. The method of claim 5 including performing the step prior to formation of the trench mask of forming a pad oxide film, a planarization stop layer, a hard mask layer and a second photoresist mask with a trench patterned window therethrough over the epitaxial layer.

7. The method of claim 6 including performing the step for completion of the formation the trench mask of comprising etching a trench window through the hard mask layer, the planarization stop layer and the pad oxide film, through the trench patterned window.

8. The method of claim 6 including performing the steps as follows:

etching a trench window through the hard mask layer, the planarization stop layer and the pad oxide film, through the trench patterned window to form the trench mask;

then stripping the second photoresist mask; and then etching the trench reaching through the epitaxial layer and the lateral implant region.

9. The method of claim 6 including performing the step of etching the oxidized trench sidewalls, the oxidized trench bottom and the oxidized sidewalls of the lateral implant region with a wet etch.

10. The method of claim 6 including performing the step of forming the lateral trenches by dry etching away the lateral implant region.

11. A method of forming a lateral trench in a semiconductor substrate comprising the steps as follows:

formation of a lateral implant mask over a top surface of the semiconductor substrate;

implanting a heavy concentration of dopant into the substrate through the lateral implant mask forming a lateral implant region in the substrate;

stripping the lateral implant mask exposing the top surface of the substrate;

formation of an epitaxial silicon layer over the top surface of the substrate burying the lateral implant region;

formation of a trench mask over the epitaxial layer;

etching a trench reaching through the epitaxial layer and bisecting the lateral implant region;

formation of oxidized trench sidewalls, an oxidized trench bottom and oxidized sidewalls of the lateral implant region;

performing a wet etch of the oxidized sidewalls of the lateral implant region until the lateral implant region is exposed; and formation of a laterally extending trench in the substrate by dry etching away the lateral implant region.

12. The method of claim 11, including performing the steps prior to formation of the implant mask comprising:

formation of a blanket thin dielectric pad layer and a blanket implant mask layer over the epitaxial silicon layer in that order;

formation of a first photoresist mask with a pattern over the blanket implant mask layer; and etching the pattern in the first photoresist mask into the blanket implant mask layer; and stripping the first photoresist mask.

13. The method of claim 12 including performing the step of implanting a heavy concentration of dopant into the substrate through the lateral implant mask thereby forming a lateral implant region in the substrate following the formation of the implant mask.

14. The method of claim 13 including performing the step of performing an activation anneal immediately after implanting the heavy concentration of dopant into the substrate through the lateral implant mask.

15. The method of claim 14 including performing the step of stripping the implant mask subsequent to the activation anneal and prior to forming the epitaxial silicon layer.

16. The method of claim 15 including performing the step of forming a pad oxide film, a planarization stop layer, a hard mask layer and a second photoresist mask with a trench patterned window therethrough over the epitaxial layer prior to formation of a trench mask.

17. The method of claim 16 including performing the step of etching a trench window through the hard mask layer, the planarization stop layer and the pad oxide film, through the trench patterned window to form the trench mask.

18. The method of claim 16 including performing the steps as follows:

etching a trench window through the hard mask layer, the planarization stop layer and the pad oxide film, through the trench patterned window to form the trench mask;

then stripping the second photoresist mask; and then etching the trench reaching through the epitaxial layer and the lateral implant region.

19. The method of claim 18 wherein the planarization stop layer is composed of silicon nitride.

20. The method of claim 18 wherein the hard mask layer formed over the planarization stop layer is composed of silicon oxide.

* * * * *